United States Patent [19]
Tsuji et al.

[11] Patent Number: 5,780,875
[45] Date of Patent: Jul. 14, 1998

[54] HYBRID OPTICAL INTEGRATION ASSEMBLY USING OPTICAL PLATFORM

[75] Inventors: Shinji Tsuji, Hidaka; Ryuta Takahashi, Hitachi; Masato Shishikura, Hachioji; Satoru Kikuchi, Kokubunji; Satoshi Aoki, Chigasaki, all of Japan

[73] Assignees: Hitachi, Ltd.; Hitachi Cable, Ltd., both of Tokyo; Hitachi Tohbu Semiconductor, Ltd., Saitama-ken; Nippon Telegraph and Telephone Corporation, Tokyo, all of Japan

[21] Appl. No.: 705,524

[22] Filed: Aug. 29, 1996

[30] Foreign Application Priority Data

Aug. 30, 1995 [JP] Japan ..................... 7-221433

[51] Int. Cl.$^6$ ........................................ H01L 27/15
[52] U.S. Cl. ..................... 257/81; 257/84; 257/98; 257/99; 385/83; 385/92
[58] Field of Search ........................ 257/80, 81, 84, 257/98, 99; 385/49, 83, 92, 131

[56] References Cited

U.S. PATENT DOCUMENTS 5,345,524   9/1994   Lebby et al. ................. 385/88
5,391,869   2/1995   Ade et al. ................. 250/227.24

FOREIGN PATENT DOCUMENTS 3731311A   3/1989   Germany.
4112471A   10/1992   Germany.

OTHER PUBLICATIONS

*Electronics letters*, "Optoelectronic Hybrid Integrated Laser Diode Module Using Planar Lightwave Circuit Platform", by S. Mino, et al., vol. 30, No. 22, Oct. 27, 1994.

"Alignment-free Photodetector–Single–Mode Fiber Coupling Using a Planarized Si Platform", 5$^{th}$ Optoelectronic Conference Technical Digest, Jul. 1994, Tabuchi et al.

"Silica–on–Terraced–Silicon Platform for Optical Hybrid Integration" Yamada et al., 5$^{th}$ Optoelectronic Conference Technical Digest, Jul. 1994.

"A Hybrid Integrated Optical WDM Transmitter/Receiver Module for Optical Subscriber Systems Utilizing a Planar Lightwave Circuit Platform", Y. Yamada et al, Optical–Fiber Communication Conference in 1995, pp. PD12–1 to PD12–5, 1995.

*Primary Examiner*—Minh-Loan Tran
*Attorney, Agent, or Firm*—Antonelli, Terry, Stout & Kraus, LLP

[57] ABSTRACT

An optical assembly structure includes, a semiconductor element generating a large amount of heat and a high impedance optical element which are to be mounted, with low optical loss on the same semiconductor substrate which has an optical waveguide formed thereon. The element generating a large amount of heat is mounted on a terrace of the semiconductor substrate directly or through an insulating layer having a thickness of submicron order, while the high impedance element is mounted in a groove which is etched into the semiconductor substrate to such an extent that the optical axis of the high impedance element mates with the optical axis of the optical waveguide layer formed on a recess in the semiconductor substrate. The optical axes can be adjusted independently for the respective elements. Alternatively, with a potential on the semiconductor substrate set equal to a supply voltage or a ground potential, a crystal substrate for a forward biased heat generating element is given the polarity opposite to that of a crystal substrate for a reverse biased element which may imply a problem of stray capacitance.

26 Claims, 6 Drawing Sheets

HYBRID OPTICAL INTEGRATION ASSEMBLY USING OPTICAL PLATFORM

BACKGROUND OF THE INVENTION

The present invention relates to a low cost optical module structure which is applied to optical access networks, optical exchange systems, optical interconnects, and so on.

There are several reports on hybrid integration of laser diodes and/or photodiodes on optical platforms. For example, H. Tabuchi, et al. reported "alignment-free photodetector single-mode fiber coupling using a planarized Si platform" (paper 15B1-3) at the fifth optoelectronics conference held at Chiba, Japan in 1994. At the same conference, Y. Yamada reported "silica-on-terraced-silicon platform for optical hybrid integration" (paper 15B1-3).

Further, there is a paper by Yamada et al entitled "A Hybird Integrated Optical WDM Transmitter/Receiver Module for Optical Subscriber Systems Utilizing a Planar Lightwave Circuit Platform", pages PD12-1 to PD12-5, reported at the Optical-fiber Communication Conference in 1995.

FIG. 1A is a top plan view illustrating the structure of a prior art optical assembly, and FIG. 1B is a cross-sectional view taken along a line I–I' in FIG. 1A. The illustrated structure includes a semiconductor laser 2 and waveguide-type photodiodes 3, each formed on an n-type substrate, which are mounted on a silicon substrate 10 having a silica waveguide 1 formed on the upper surface thereof. The optical waveguide 1 includes an under cladding layer 12 made of silica embedded in a recess (⊔ portion) of the silicon substrate 10, an adjusting layer 13 made of silica formed on the under cladding layer 12, an optical waveguide core 14 having a refractive index larger than that of the under cladding layer 12, and an upper cladding layer 15 made of silica. The semiconductor laser 2 and the waveguide-type photodiodes 3 are fixed opposite to a common port for optical input and output of the optical waveguide 1 on electrodes 720, 730 on a place for mounting 5 formed by selectively etching glass on a terrace (⊓ portion) 11 of the silicon substrate 10.

Since the optical waveguide 1 and the optical elements 2, 3 are required to be optically connected to each other with low loss, techniques such as a fine positioning control using index marks, self-alignment utilizing surface tension of solder bump, and so on have been proposed as low cost mounting methods in order to adjust the optical axes between the optical waveguide core 14 and the mounted elements in the plane of Si bench. In addition, several designs for reducing the influence of misalignment have been included in the optical assembly, for example, a mounted optical element is selected such that its spot size is close to that of a silica waveguide.

SUMMARY OF THE INVENTION

It is an object of the present invention to provide an optical assembly structure which is capable of mounting an element generating a large amount of heat and a high impedance optical element on the same optical waveguide substrate with the optical axes thereof mated with the optical axis of an optical waveguide at a low cost.

To achieve the above object, an element generating a large amount of heat is fixed on a terrace of a semiconductor substrate directly or through an insulating layer having a thickness of submicron order, so that the element generating a large amount of heat can be mounted with a low heat resistance. In the case of laser diodes, the optical axes of the laser and the silica optical waveguide should be adjusted for the best optical coupling. This adjustment can be attained physically by setting the waveguide axis height measured from the silicon terrace surface to the sum of the active layer depth of the laser diode and the thicknesses of an electrode and solder. When the high impedance optical element is mounted in a groove which is etched into the semiconductor substrate to such an extent that the optical axis of the high impedance optical element mates with the optical axis of the optical waveguide formed on a recess of the semiconductor substrate, the high impedance optical element can be mounted substantially free from any electrical influence of the conductive silicon substrate.

As another approach, it is also possible to equivalently reduce a stray capacitance of the high impedance optical element, including a stray capacitance caused by a connection with electric circuits. Specifically, the semiconductor substrate is set at the same potential as a supply voltage or a grounding potential, and signal lines of two or more mounted elements are kept away from the semiconductor substrate. This structure can be realized by mounting a forward biased heat generating element and a reverse biased high impedance optical element, causing a problem of a stray capacitance, with their polarities opposite to each other.

With the foregoing approaches, the element generating a large amount of heat and the high impedance element can be mounted on the same optical waveguide substrate with their optical axes mated with the optical axis of the waveguide at a low cost.

DETAILED DESCRIPTION OF THE PREFERRED EMBODIMENTS

Embodiment 1

Figure 1A:
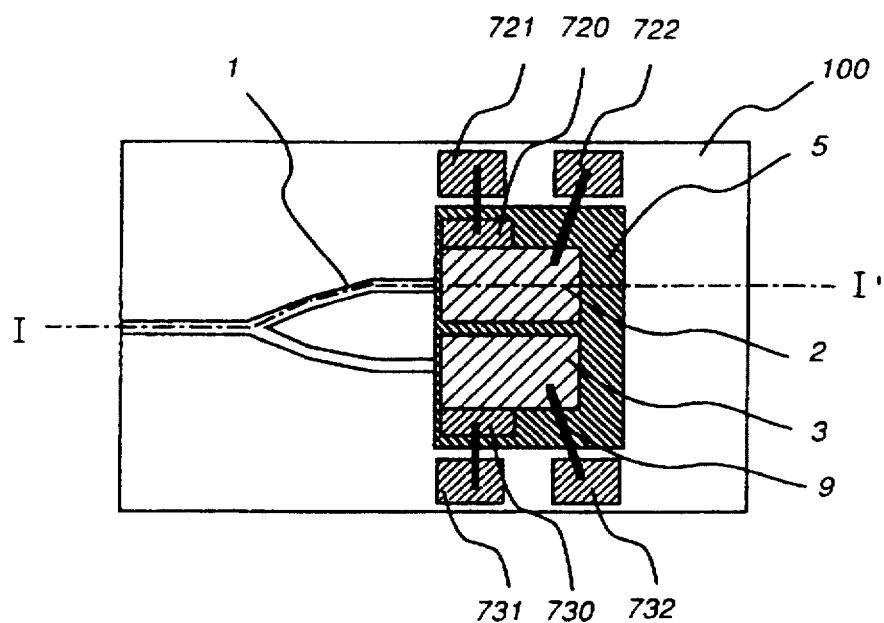
FIGS. 1A, 1B are a top plan view and a cross-sectional view respectively illustrating the structure of a prior art optical assembly.
Figure 1B:
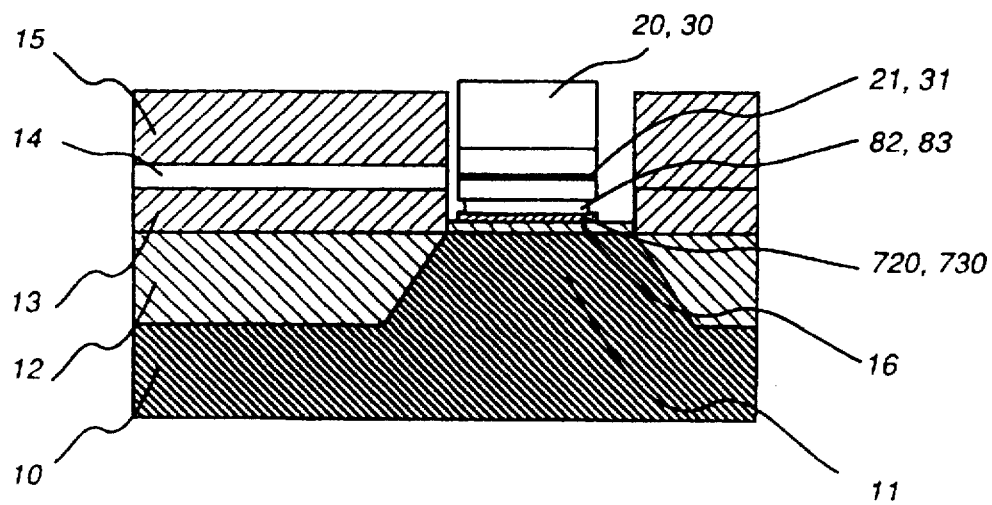
Figure 2A:
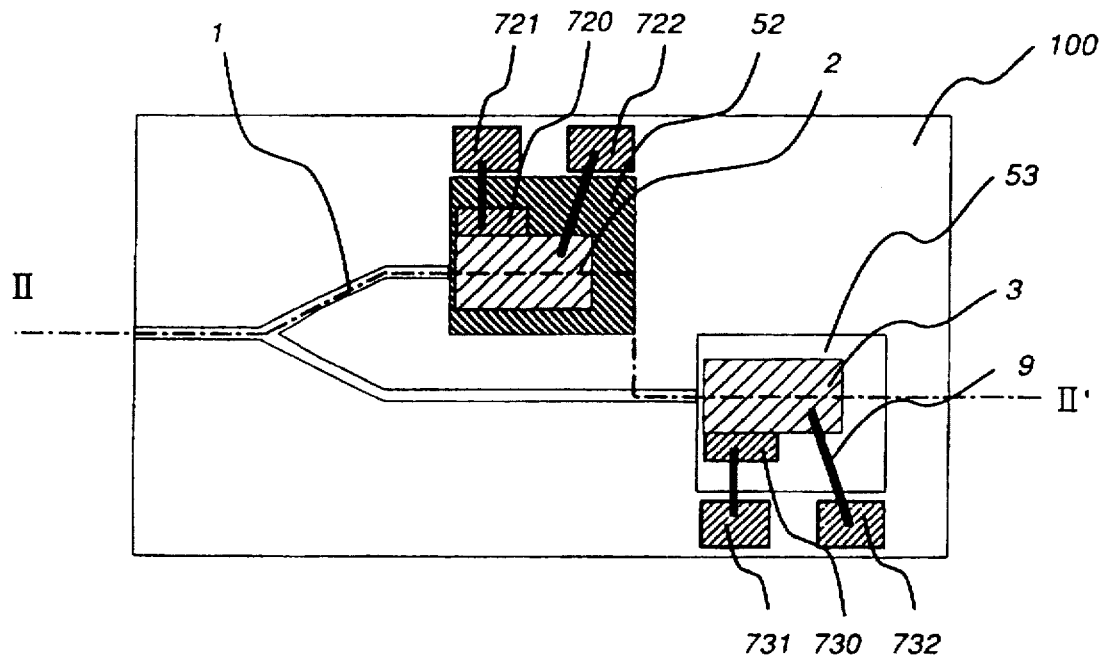
FIGS. 2A, 2B are a top plan view and a cross-sectional view respectively illustrating a structure associated with a first and a fourth embodiments of the present invention.
Figure 2B:
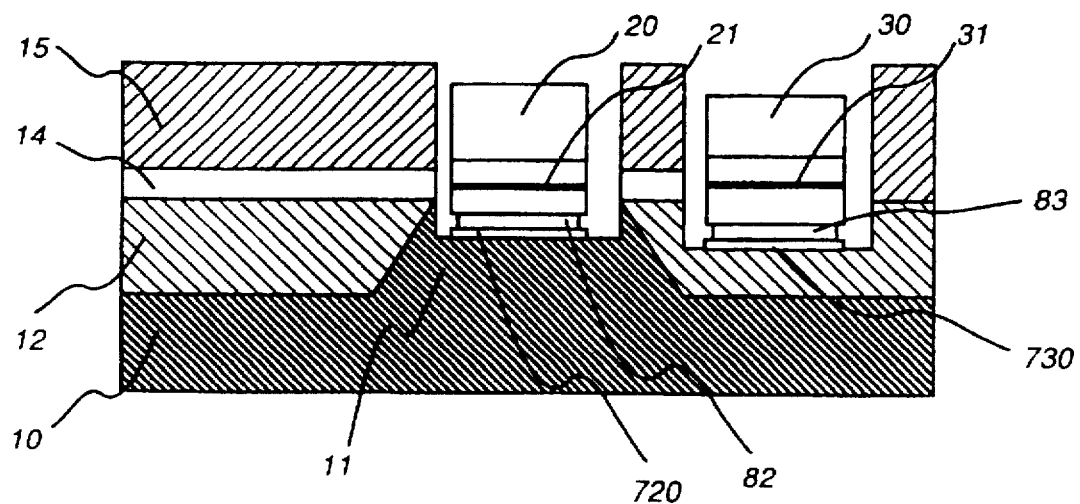

FIG. 2A is a top plan view illustrating the structure of a first embodiment of the present invention, and FIG. 2B is a cross-sectional view taken along a line II–II' in FIG. 2A. On a silicon substrate 10 having a terrace 11 on the upper surface thereof, an under cladding layer 12 made of silica is formed in a thickness sufficiently larger than the height of the terrace 11 (20–30 m) using an electron beam deposition. Here, a silicon having a crystal orientation of (100) with an offset less than 5 degrees is used such that the terrace 11 has a symmetric shape. Thereafter, the under cladding layer 12 is polished until the upper surface of the terrace of the silicon substrate 10 is completely exposed to planarize the terrace 11 of the silicon substrate 10 and the under cladding layer 12. On the planarized upper surfaces of the terrace 11 and the under cladding layer 12, silica containing titanium, germanium, and so on is deposited by electron beam deposition and patterned to form an optical waveguide core 14. Next, silica free from additives is deposited by electron beam deposition on the optical waveguide core 14 to form an upper cladding layer 15. Then, the upper cladding layer 15 and the optical waveguide core 14 are partially dry-etched using fluorine-based gas until the upper surface of the terrace 11 of the silicon substrate 10 is exposed. Since the etching is stopped when the surface of the silicon substrate 10 is exposed, excessive etching would not cause any problem. Rather, the dry etching may be stopped at the time the depth of a recess serving as a second place for mounting 53 reaches a point at which the optical axis 31 of a waveguide type photodiode 3, to be mounted in the recess, mates with the optical axis of the optical waveguide core 14. Since the etching rate can be controlled at approximately 0.1 –1 µm per minute, the depth of the recess can be controlled with good reproducibility by controlling etching time. Since the length from the upper surface of the second place for mounting 53 to the silicon substrate 10 is 10 micron or more, an increase in stray capacitance in the waveguide type photodiode 3 through the silicon substrate 10 is 0.02 pF or less.

Next, since the optical axis of the optical waveguide core 14 in a first place for mounting 52 does not mate with the optical axis 21 of a semiconductor laser 2, the silicon substrate 10 is selectively etched to adjust only the height of the first place for mounting 52 without affecting the second place for mounting 53. In this way, the optical axes of the two places for mounting 52, 53 can be adjusted independently of each other. Next, electrode layers made of titanium, platinum, and gold are formed on the respective places for mounting 52, 53 by electron beam deposition and patterned in compliance with the shapes of electrodes to form electrodes 720, 721, 722, 730, 731, 732, thus fabricating an optical waveguide substrate 100. In the first embodiment, the optical waveguide 1 has a Y-shape in the top plan view, where one terminal is utilized as a common port for optical input and output and two branched terminals are utilized as a port for connecting to the semiconductor laser 2 on the first place for mounting 52 and a port for connecting to the waveguide type photodiode 3 on the second place for mounting 53, respectively. Index patterns for mounting the elements are made simultaneously with the formation of the electrode pattern. In addition, a crystal substrate 20 of the semiconductor laser 2 and a crystal substrate 30 of the waveguide type photodiode 3, used for the mounting, are both made of n-type InP crystal.

Next, the semiconductor laser 2 is mounted on the electrode 720 through an AuSn thin-film solder 82 (having a thickness ranging from 1 to 6 µm) by detecting index patterns using transmission infrared light illuminated from the backside of the silicon platform. An index pattern stamped on the semiconductor laser 2 and an index pattern stamped on the upper surface of the silicon substrate forming the first place for mounting 52 are simultaneously transmitted by infrared light, observed by an infrared TV camera to detect relative misalignment between the patterns, and aligned. After the alignment, the solder 82 is melted by heating to thereby fix the semiconductor laser 2 thereon. Then, 64 a similar method, the waveguide type photodiode 3 is fixed on the second place for mounting 53 using solder 83. The electrode 720 is connected to the electrode 721 by an Au wire 9 while the semiconductor laser 2 is connected to the electrode 722 by an Au wire 9 to establish electric connections of the semiconductor laser 2. Similarly, the electrode 730 is connected to the electrode 731 by an Au wire 9 while the waveguide type photodiode 3 is connected to the electrode 732 by n Au wire 9 to establish electric connections of the waveguide type photodiode 3.

Figure 3:
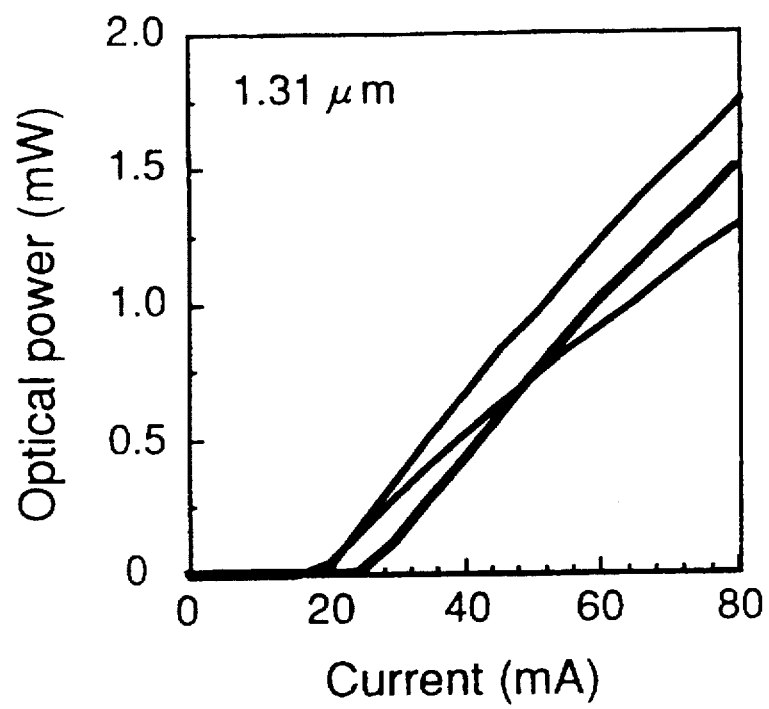
FIG. 3 is a graph showing an optical output characteristic associated with the first embodiment of the present invention.

After the trial manufacturing of the optical assembly, a fiber is connected to the common port for optical input and output of the optical assembly to evaluate the optical output characteristic and sensitivity characteristic of the optical assembly. FIG. 3 shows the optical output characteristics of three optical assemblies. When the semiconductor laser 2 is driven, a fiber optical output of 1 mW is generated with an operating current at 50 mA. It can be confirmed that a positioning error after mounting the semiconductor laser 2 can be controlled within 1 µm by comparing the optical output characteristic of the semiconductor laser 2 before being mounted. Also, for a light receiving sensitivity, a sufficient sensitivity characteristic of 0.31 A/W is obtained. A positioning error of the waveguide type photodiode 3 is also within 1 µm. In addition, from the result that the thermal resistance of the semiconductor laser is below 40° C./W, it is confirmed that a sufficient heat releasing characteristic can be ensured. The capacitance of the photodiode is not more than 1 pF, including a capacitance due to the mounting thereof.

Embodiment 2

Figure 4A:
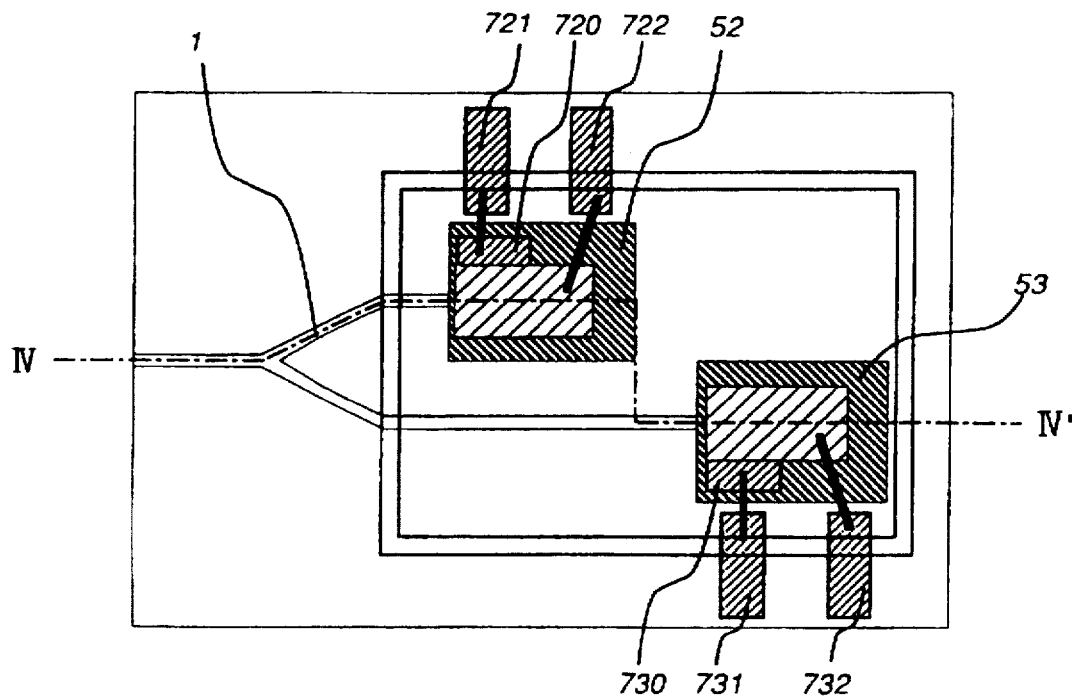
FIGS. 4A, 4B are a top plan view and a cross-sectional view respectively illustrating a structure associated with a second embodiment of the present invention.
Figure 4B:
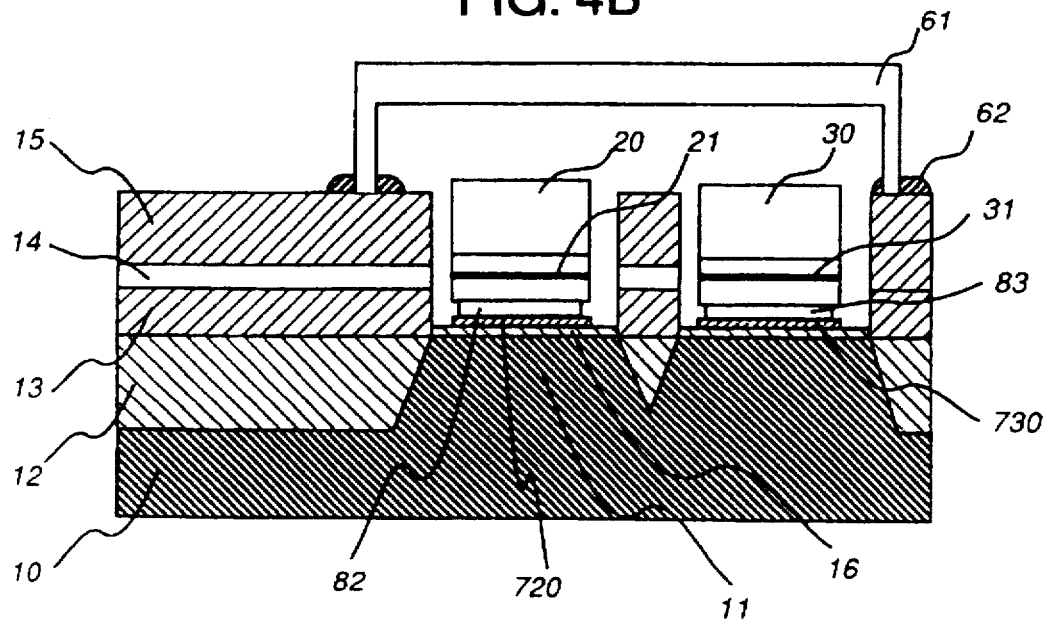

FIG. 4A is a top plan view illustrating a second embodiment of the present invention, and FIG. 4B is a cross-sectional view taken along a line IV–IV' in FIG. 4A. An under cladding layer 12 made of silica is formed on a silicon substrate 10 having terraces 11 on the upper surface thereof in a thickness sufficiently larger than the height of the terrace 11 (20–30 µm) using electron beam deposition. Here, a silicon having a crystal orientation of (100) with an offset less than 5 degrees is used such that each of the terraces 11 has a symmetric shape. Thereafter, the under cladding layer 12 is polished until the upper surface of the silicon substrate 10 is completely exposed to planarize the terraces 11 of the silicon substrate 10 and the under cladding layer 12. An adjusting layer 13 made of silica is deposited on the planarized upper surfaces of the terraces 11 and the under cladding layer 12, and then silica containing titanium, germanium, and so on is deposited by electron beam deposition and patterned to form an optical waveguide core 14. Next, silica free from additives is deposited by electron beam deposition on the optical waveguide core 14 to form an upper cladding layer 15. Thereafter, the upper cladding layer 15 and the optical waveguide core 14 are partially dry-etched using fluorine-based gas until the upper surfaces of the terraces 11 of the silicon substrate 10 are exposed. Since the etching is stopped when the surface of the silicon substrate 10 is exposed, excessive etching would not cause any problem. The adjusting layer 13 is formed to mate the optical axis of the optical waveguide core 14 with the respective optical axes 21, 31 of a semiconductor laser 2 and a waveguide type photodiode 3.

Next, after silicon oxide films 16 having a thickness equal to or less than 0.5 micron are formed on places for mounting 52, 53, respectively, electrode layers made of titanium, platinum, and gold are formed by electron beam deposition and patterned in compliance with electrode shapes to fabricate an optical waveguide substrate. Index patterns for mounting elements are stamped simultaneously with the formation of the electrode pattern. Also in the second embodiment, the optical waveguide 1 has a Y-shape in the top plan view, where one terminal is utilized as a common port for optical input and output and two branched terminals are utilized as a port for connecting to the semiconductor laser 2 on the first place for mounting 52 and a port for connecting the waveguide type photodiode 3 on the second place for mounting 53, respectively.

Next, the semiconductor laser 2 is mounted on the electrode 720 through an AuSn thin-film solder 82 (having a thickness ranging from 1 to 6 µm) by detecting index marks using transmission infrared light illuminated from the backside of the silicon platform. An index pattern stamped on the semiconductor laser 2 and an index pattern stamped on the upper surface of the silicon substrate forming the first place for mounting 52 are simultaneously transmitted by infrared light, observed by an infrared TV camera to detect relative misalignment between the patterns, and aligned. After the alignment, the solder 82 is melted by heating to fix the semiconductor laser 2 thereon. Then, by a similar method, the waveguide type photodiode 3 is fixed on the second place for mounting 53 using solder 83. After mounting the elements, a lid 61 made of glass is placed overlying grooves, and fixed by a resin 62. The use of the lid protects the elements from damage during a fiber connection process and enables stable trial manufacturing of the optical assemblies.

In the second embodiment, unlike the first embodiment, an n-type InP crystal is used for the crystal substrate 20 of semiconductor laser 2, while p-type InP crystal is used for crystal substrate 30 of the waveguide type photodiode 3. In this way, the silicon substrate 10 is set at the same potential as a power supply, and signal lines for the waveguide type photodiode 3 can be placed on the crystal substrate side, whereby an increase in stray capacitance can be reduced to 0.3 pF or less.

Figure 5:
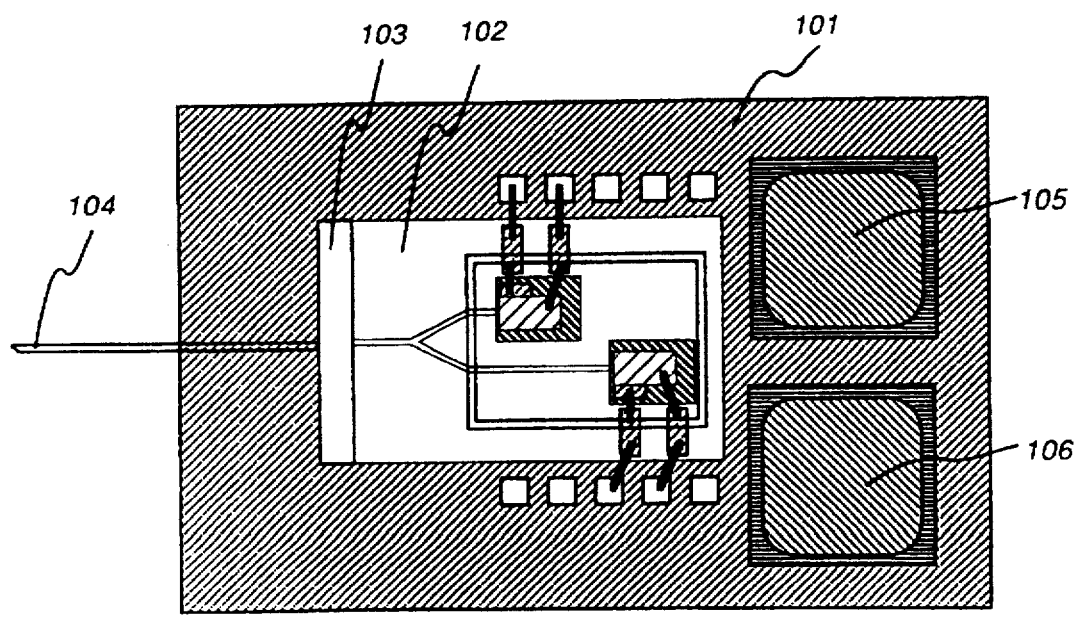
FIG. 5 is a top plan view illustrating an example in which the present invention is applied to a second transmission board.

As seen in FIG. 5, after, the trial manufacturing of the optical assembly 100, a fiber 104 is connected to the common port for optical input and output of the optical assembly 100 using a glass block 103 to evaluate the optical output characteristic and sensitivity characteristic. As a result, similar characteristics to those of the first embodiment were obtained. Then, the optical assembly 100 is mounted on a printed circuit board 101 together with a laser driving IC 105 and a pre-amplifier IC 106. FIG. 5 illustrates how the optical assembly is mounted on the printed circuit board 101. Two sets of such trial boards are prepared and placed opposite to each other to evaluate the transmission characteristic. With a transmission rate at 30 Mb/s and a transmission length extending 5 km, it is confirmed that the transmission can be performed with a bit error rate (BER) equal to or less than 10 to the minus ninth power($10^{-9}$).

Embodiment 3

Figure 6A:
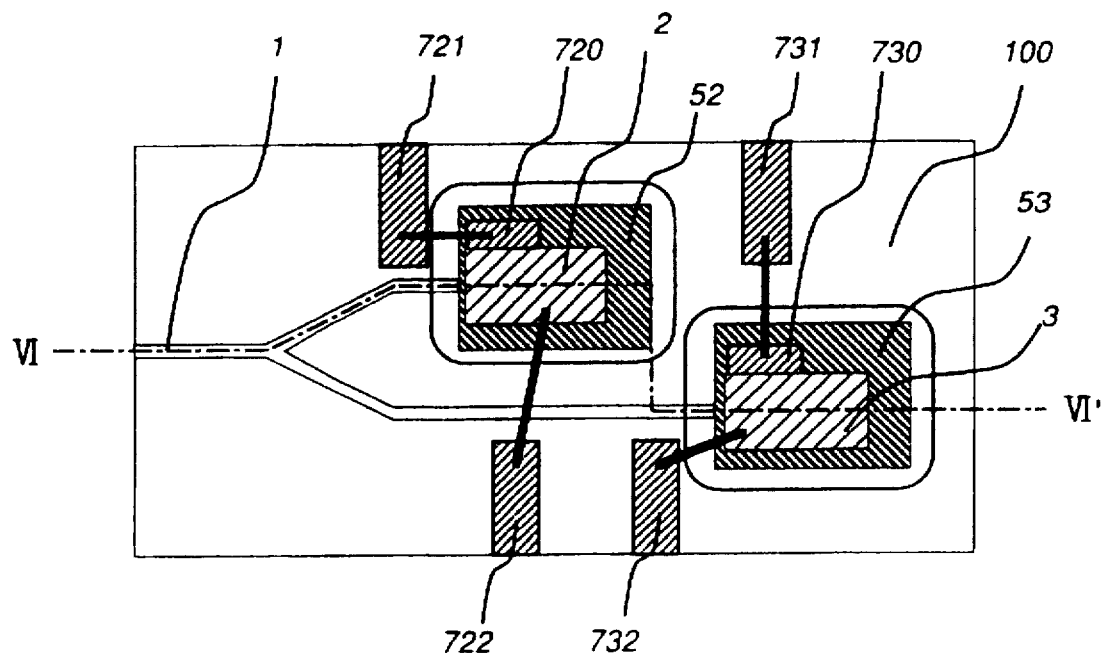
FIGS. 6A, 6B are a top plan view and a cross-sectional view respectively illustrating a structure associated with a third embodiment of the present invention.
Figure 6B:
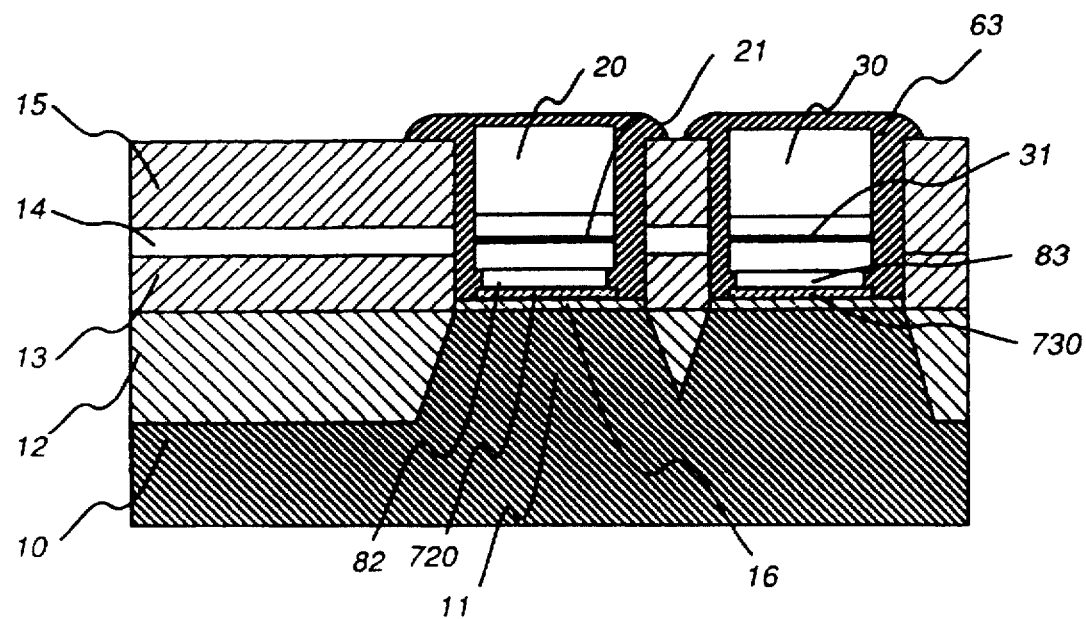

FIG. 6A is a top plan view illustrating a third embodiment of the present invention, and FIG. 6B is a cross-sectional view taken along a line VI–VI' in FIG. 6A. Instead of using the lid 61 for covering the mounted elements as in the second embodiment, the third embodiment fills an epoxy resin 63 in grooves for protecting elements 2, 3. The filled epoxy resin 63 substantially completely prevents the characteristics of the elements from deteriorating. Eleven sets of modules each having the optical assembly of the third embodiment mounted thereon are left in a test chamber at a temperature of 85° C. and a relative humidity of 90% RH to evaluate deteriorations in the optical output characteristic and optical sensitivity characteristic. After a test over 2000 hours, none of the 11 modules exhibit deteriorated characteristics. On the other hand, when the same test is conducted on an optical module without the filled resin for protection, the results showed that after 200–500 hours, a dark current in the photodiode 3 abruptly increases, thus confirming the validity of the filled resin of the third embodiment.

Embodiment 4

In a fourth embodiment of the present invention, the material for the optical waveguide is changed from silica used in the third embodiment to polyimide. Fluorinated polyimide is used for cladding layers 12, 13, 15, and an optical waveguide is formed such that a refractive index difference with a core is limited to 1%. Since an organic material is used for the optical waveguide 1, the film formation can be completed in a shorter time by spin coating, thus facilitating a further reduction in cost. An epoxy resin is used to fill grooves, as is the case of the third embodiment.

Embodiment 5

Figure 7A:
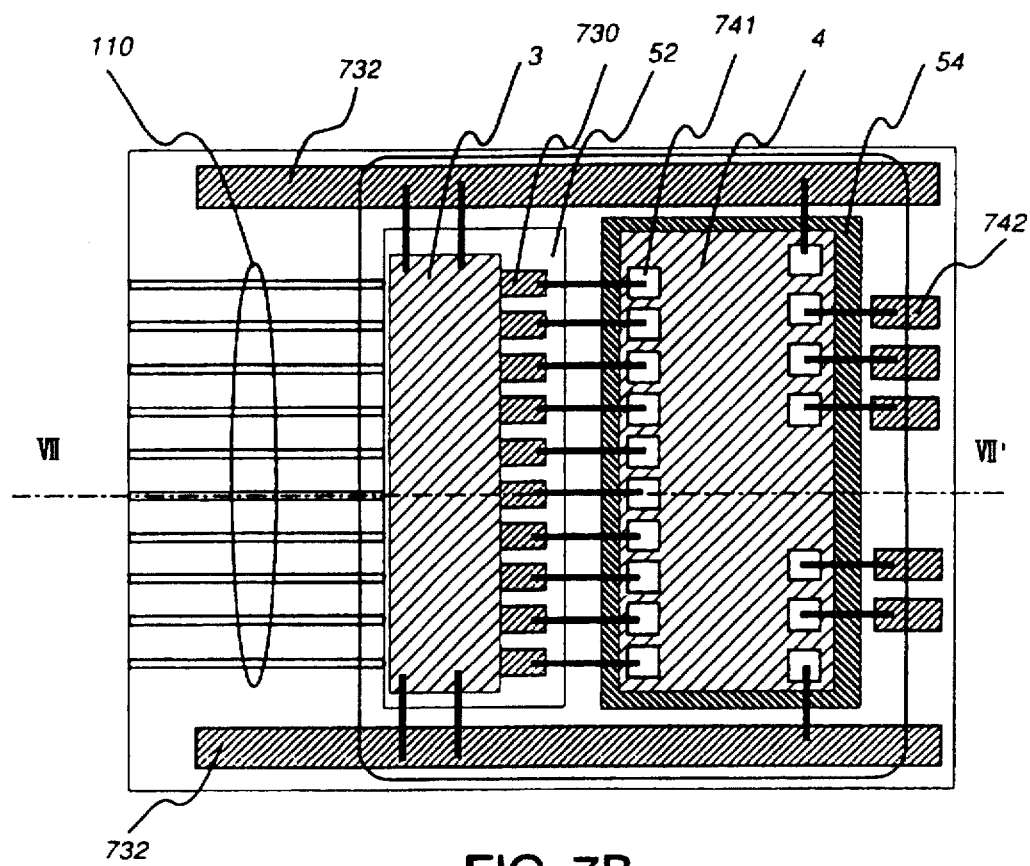
FIGS. 7A, 7B are a top plan view and a cross-sectional view respectively illustrating a structure associated with a fifth embodiment of the present invention.
Figure 7B:
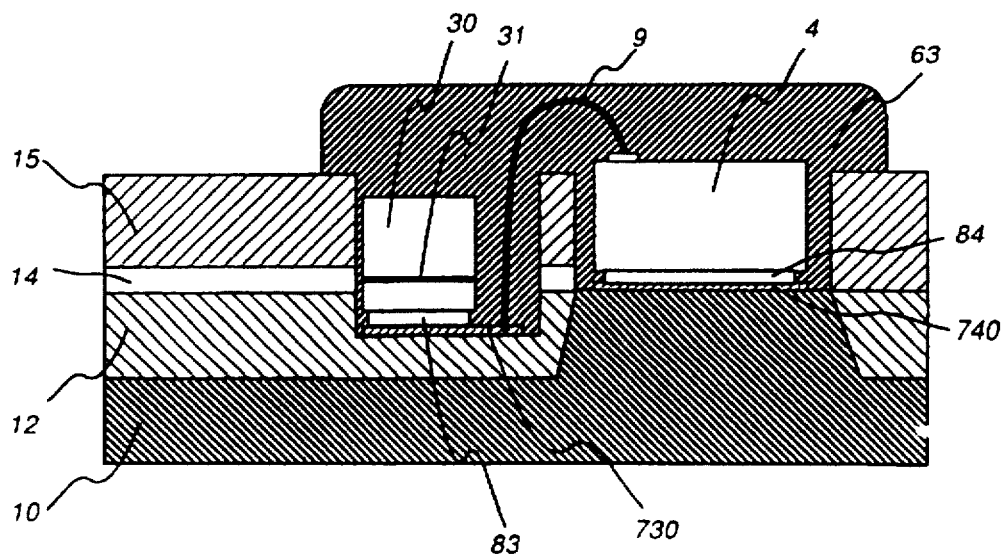

FIG. 7A is a top plan view illustrating a fifth embodiment of the present invention, and FIG. 7B is a cross-sectional view taken along a line VII–VII' in FIG. 7A. In the fifth embodiment, a waveguide type photodiode array 3 is optically connected to a waveguide array 110. A trial manufacturing process of an optical waveguide substrate used herein for mounting elements is similar to that of the first embodiment. In the fifth embodiment, a pre-amplifier IC array 4 having ten channels is mounted on a place for mounting 54 formed on a terrace 11 of a silicon substrate 10, and a waveguide type photodiode array 3 having ten channels is mounted on a place for mounting 52 formed by etching into a glass surface of a recess in the silicon substrate 10. The pre-amplifier IC array 4 is made on a trial basis using an Si bipolar process since the pre-amplifier IC array may operate at high speeds up to approximately 1 Gb/s. The waveguide type photodiode array 3 is connected to an optical waveguide core 14 having an array of ten channels.

Ten channels of fibers are connected to the optical assembly of the fifth embodiment to measure a light receiving sensitivity. As a result, the optical assembly exhibits a light receiving characteristic with small variations between channels at 0.85±0.02 A/W. Also, the optical assembly is evaluated in terms of a receiver sensitivity at a rate of 200 bits/second for each channel over a transmission length extending 100 m. On each channel, error free operation continues for fifty hours or more. Since the application of the waveguide type photodiode facilitates the mating of an electric wire face with a light incident face, a simple module can be realized.

In the present invention, each of the heights of the optical axes of the semiconductor light receiving element 3 and semiconductor light emitting element 2 is adjusted to the height of the optical axis of the optical waveguide 1 with an offset equal to or less than 3 microns.

According to the present invention, an element generating a large amount of heat and a high impedance optical element can be mounted on the same optical waveguide substrate with the optical axes thereof mated with the optical axis of an optical waveguide. In this way, a hybrid optical circuit having a variety of optical elements and electric elements mounted on a waveguide can be mounted at a low cost. Thus, large capacity communications supporting multimedia environments can be accomplished by laying optical fibers to respective houses. In addition, since the optical assembly of the present invention allows for the introduction of optical fibers for wiring between apparatuses, larger scale parallel processing can be readily realized.

Many different embodiments of the present invention may be constructed without departing from the spirit and scope of the invention. It should be understood that the present invention is not limited to the specific embodiments described in this specification. To the contrary, the present invention is intended to cover various modifications and equivalent arrangements included within the spirit and scope of the claims.

What is claimed is:

1. An optical assembly, comprising:
   a semiconductor substrate;
   a semiconductor light emitting element mounted on said semiconductor substrate; and
   a semiconductor light receiving element mounted on said semiconductor substrate,
   wherein said semiconductor light emitting element is mounted on said semiconductor substrate directly or through a thin film layer,
   said semiconductor light receiving element is mounted on said semiconductor substrate through a dielectric layer,
   said semiconductor substrate includes an optical waveguide formed thereon, said optical waveguide having said dielectric layer,
   wherein a material inserted between said semiconductor light receiving element and said semiconductor substrate has a thickness which is greater than the thickness of a material inserted between said semiconductor light emitting element and said semiconductor substrate, and
   said optical waveguide has its optical axis adjusted to the optical axis of said semiconductor light emitting element, and said optical waveguide has its optical axis adjusted to the optical axis of said semiconductor light receiving element.

2. An optical assembly according to claim 1, wherein said semiconductor substrate has a terrace for mounting said semiconductor light emitting element thereon;
   said semiconductor light emitting element is mounted on said terrace;
   said semiconductor substrate has a bottom around said terrace;
   said optical waveguide is formed on said bottom; and
   said semiconductor light receiving element is mounted in a groove formed by partially etching said dielectric layer.

3. An optical assembly according to claim 2, wherein said groove in which said optical light receiving element mounted is covered by a lid.

4. An optical assembly according to claim 2, wherein the interior of said optical groove in which said semiconductor light receiving element is mounted is filled with a resin to bury a light path.

5. An optical assembly according to claim 1, wherein said semiconductor light receiving element has an optical waveguide structure, and the height of the optical axis of said semiconductor light receiving element is adjusted to the height of the optical axis of said optical waveguide with an offset equal to or less than 3 microns.

6. An optical assembly according to claim 1, wherein said semiconductor light receiving element is applied with a predetermined voltage such that said semiconductor light receiving element is reversely biased.

7. An optical assembly according to claim 1, wherein a material for said semiconductor substrate is silicon having a crystal orientation of (100) with an offset less than 5 degrees.

8. An optical assembly according to claim 1, wherein a dielectric material of said optical waveguide includes silicon oxide.

9. An optical assembly according to claim 1, wherein said semiconductor light emitting element has an optical waveguide structure, and the height of the optical axis of said semiconductor light emitting element is adjusted to the height of the optical axis of said optical waveguide with an offset equal to or less than 3 microns.

10. An optical assembly according to claim 1, wherein said optical waveguide connected to said semiconductor light emitting element is optically coupled to said optical waveguide connected to said semiconductor light receiving element.

11. An optical transmission module using the optical assembly according to claim 1.

12. An optical assembly, comprising:
    a semiconductor substrate;
    a semiconductor light emitting element mounted on said semiconductor substrate; and
    a semiconductor light receiving element mounted on said semiconductor substrate;
    wherein said semiconductor light emitting element is mounted on said semiconductor substrate directly or through a thin film layer,
    said semiconductor light receiving element is mounted on said semiconductor substrate directly or through a thin film layer,
    said semiconductor light emitting element is mounted to be biased in a forward direction, and said semiconductor light receiving element is mounted to be biased in a reverse direction,
    said semiconductor light emitting element and said semiconductor light receiving element are mounted so that signal lines for said semiconductor light emitting element and said semiconductor light receiving element are arranged at a side a distance from said semiconductor substrate,
    an optical waveguide having a dielectric layer is formed on said semiconductor substrate, and
    said optical waveguide has its optical axis adjusted to the optical axis of said semiconductor light emitting element, and said optical waveguide has its optical axis adjusted to the optical axis of said semiconductor light receiving element.

13. An optical assembly according to claim 12, wherein said semiconductor light emitting element and said semiconductor light receiving element are mounted on terraces formed on said semiconductor substrate.

14. An optical assembly according to claim 13, wherein an insulating film is formed on each of said terraces.

15. An optical assembly according to claim 12, wherein said semiconductor light receiving element has an optical waveguide structure, and the height of the optical axis of said semiconductor light receiving element is adjusted to the height of the optical axis of said optical waveguide with an offset equal to or less than 3 microns.

16. An optical assembly according to claim 12, wherein a material for said semiconductor substrate is silicon having a crystal orientation of (100) with an offset less than 5 degrees.

17. An optical assembly according to claim 12, wherein a dielectric material of said optical waveguide includes silicon oxide.

18. An optical assembly according to claim 12, wherein said semiconductor light emitting element has an optical waveguide structure, and the height of the optical axis of said semiconductor light emitting element is adjusted to the height of the optical axis of said optical waveguide with an offset equal to or less than 3 microns.

19. An optical assembly according to claim 12, wherein said optical waveguide connected to said semiconductor light emitting element is optically coupled to said optical waveguide connected to said semiconductor light receiving element.

20. An optical assembly according to claim 12, wherein said semiconductor light receiving element is mounted on a groove formed on said semiconductor substrate, said groove being covered by a lid.

21. An optical assembly according to claim 12, wherein said semiconductor light receiving element is mounted on a groove formed on said semiconductor substrate, and an interior of said groove and an optical path are filled with a resin.

22. An optical transmission module using the optical assembly according to claim 12.

23. An optical assembly comprising:

a semiconductor substrate;

a pre-amplifier element mounted on said semiconductor substrate; and a semiconductor light receiving element mounted on said semiconductor substrate, wherein said pre-amplifier element is mounted on said semiconductor substrate directly or through a thin film layer, said semiconductor light receiving element is mounted on said semiconductor substrate through a dielectric layer, wherein a material inserted between said semiconductor light receiving element and said semiconductor substrate has a thickness which is greater than the thickness of a material inserted between said pre-amplifier element and said semiconductor substrate, and said semiconductor substrate includes an optical waveguide formed thereon, said optical waveguide including said dielectric layer.

24. An optical assembly, comprising:

a semiconductor substrate;

an element generating a large amount of heat mounted on said semiconductor substrate; and a high impedance optical element mounted on said semiconductor substrate, wherein said element generating a large amount of heat is mounted on said semiconductor substrate directly or through a thin film layer, said high impedance optical element is mounted on said semiconductor substrate through a dielectric layer, said semiconductor substrate includes an optical waveguide formed thereon, said optical waveguide including said dielectric layer, wherein a material inserted between said high impedance optical element and said semiconductor substrate has a thickness which is greater than the thickness of a material inserted between said element generating a large amount of heat and said semiconductor substrate, and said optical waveguide has its optical axis adjusted to the optical axis of said element generating a large amount of heat, and said optical waveguide has its optical axis adjusted to the optical axis of said high impedance optical element.

25. An optical assembly, comprising:

a semiconductor substrate;

an element generating a large amount of heat mounted on said semiconductor substrate; and a high impedance optical element mounted on said semiconductor substrate, wherein said element generating a large amount of heat is mounted on said semiconductor substrate directly or through a thin film layer, said high impedance optical element is mounted on said semiconductor substrate directly or through a thin film layer, said element generating a large amount of heat is forward biased, and said high impedance optical element is reverse biased, said element generating a large amount of heat and said high impedance optical element are mounted so that signal lines for said element generating a large amount of heat and said high impedance optical element are arranged at a side a distance from said semiconductor substrate, an optical waveguide having a dielectric layer is formed on said semiconductor substrate, and said optical waveguide has its optical axis adjusted to the optical axis of said element generating a large amount of heat, and said optical waveguide has its optical axis adjusted to the optical axis of said high impedance optical element.

26. An optical assembly, comprising:

a semiconductor substrate;

an element generating a large amount of heat mounted on said semiconductor substrate; and a high impedance optical element mounted on said semiconductor substrate, wherein said element generating a large amount of heat is mounted on said semiconductor substrate directly or through a thin film layer, said high impedance optical element is mounted on said semiconductor substrate through a dielectric layer, wherein a material inserted between said high impedance optical element and said semiconductor substrate has a thickness which is greater than the thickness of a material inserted between said element generating a large amount of heat and said semiconductor substrate, and said semiconductor substrate includes an optical waveguide formed thereon, said optical waveguide including said dielectric layer.

* * * * *